United States Patent [19]
Gardner et al.

[11] Patent Number: 6,066,519
[45] Date of Patent: May 23, 2000

[54] SEMICONDUCTOR DEVICE HAVING AN OUTGASSED OXIDE LAYER AND FABRICATION THEREOF

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 09/061,536

[22] Filed: Apr. 16, 1998

[51] Int. Cl.[7] .................... H01L 21/336; H01L 21/8234
[52] U.S. Cl. .................... 438/197; 438/778; 438/787
[58] Field of Search .................... 438/151, 197, 438/778, 786, 787, 788, 789, 790; 23/293 R, 294 R

[56] References Cited

U.S. PATENT DOCUMENTS 4,305,725   12/1981   Gubitose et al. .................... 23/293 R
5,863,843   1/1999   Green et al. .................... 438/771

Primary Examiner—Sara Crane

[57] ABSTRACT

A semiconductor device having an oxide layer formed by outgassing oxide from a showerhead and an apparatus and process for fabricating such a device is provided. A process for fabricating a semiconductor device, in accordance with one embodiment of the invention, includes placing a substrate in a chamber having an oxide source showerhead and outgassing oxide from the showerhead to form an oxide layer on the substrate. The oxide layer may be used, at least in part, as a gate dielectric for a transistor device and may have a thickness as thin as one or two molecules. The oxide source showerhead may, for example, be formed from a block of quartz, thereby providing a silicon oxide layer on the substrate.

19 Claims, 4 Drawing Sheets

SEMICONDUCTOR DEVICE HAVING AN OUTGASSED OXIDE LAYER AND FABRICATION THEREOF

FIELD OF THE INVENTION

The present invention is directed generally to semiconductor devices and, more particularly, to a semiconductor device having an outgassed oxide layer and fabrication thereof.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 101, which acts as a conductor, to which an input signal is typically applied via a gate terminal (not shown). Heavily doped source 103 and drain 105 regions are formed in a semiconductor substrate 107 and are respectively connected to source and drain terminals (not shown). A channel region 109 is formed in the semiconductor substrate 107 beneath the gate electrode 101 and separates the source 103 and drain 105 regions. The channel is typically lightly doped with a dopant type opposite to that of the source 103 and drain 105 regions. The gate electrode 101 is physically separated from the semiconductor substrate 107 by an insulating layer 111, typically an oxide layer such as $SiO_2$. The insulating layer 111 is provided to prevent current from flowing between the gate electrode 101 and the semiconductor source region 103, drain region 105 or channel region 109.

In operation, an output voltage is typically developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner an electric field controls the current flow through the channel region 109. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

One important step in the manufacture of MOS devices is the formation of the gate oxide layer. The gate oxide layer is typically grown in active regions of the device. In order to obtain a high-quality gate oxide layer, the surface of the active area is often wet-etched to remove any residual oxide. The gate oxide layer is then grown slowly, typically through dry oxidation. It is important to carefully control the growth of the gate oxide layer because the thickness and uniformity of the gate oxide layer can significantly impact the overall operation of the device being formed. For example, the drain current in a MOS transistor is inversely proportional to the gate-oxide thickness at a given set of terminal voltages. Accordingly, it is normally desired to make the gate oxide as thin as possible, taking into consideration the oxide breakdown and reliability considerations of the process and technology being used.

The above described conventional techniques for forming gate oxide layers impose limitations on the minimum thickness of the gate oxide layer and on the ability to control the uniformity of the gate oxide layer. As the thresholds for minimum thickness and uniformity control are reached, the ability to further scale down the semiconductor devices is hindered.

SUMMARY OF THE INVENTION

Generally, the present invention relates to a semiconductor device having an oxide layer formed by outgassing oxide from a showerhead and an apparatus and process for fabricating such a device. A process for fabricating a semiconductor device, in accordance with one embodiment of the invention, includes placing a substrate in a chamber having an oxide source showerhead and outgassing oxide from the showerhead to form an oxide layer on the substrate. The oxide layer may be used, at least in part, as a gate dielectric for a transistor device and may have a thickness as thin as one or two molecules. The oxide source showerhead may, for example, be formed from a block of quartz, thereby providing a silicon oxide layer on the substrate.

A semiconductor device, consistent with one embodiment of the invention, includes a substrate, a silicon oxide gate dielectric layer having a thickness of two molecules or less disposed over the substrate, and a gate electrode disposed over the silicon oxide gate dielectric layer. In some cases, a second dielectric layer may be disposed between the silicon oxide gate dielectric layer and the gate electrode.

A chamber for forming an outgassed oxide on a substrate, in accordance with another embodiment of the invention, includes an oxide source showerhead, a gas source in fluid communication with the showerhead, and one or more controllers coupled to the gas source for controlling the flow of gas through the oxide source showerhead to carry outgassed oxide from the showerhead to the substrate. In one particular embodiment, the showerhead is a quartz showerhead and the gas source includes nitrogen and $NF_3$.

The above summary of the present invention is not intended to describe each illustrated embodiment or implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
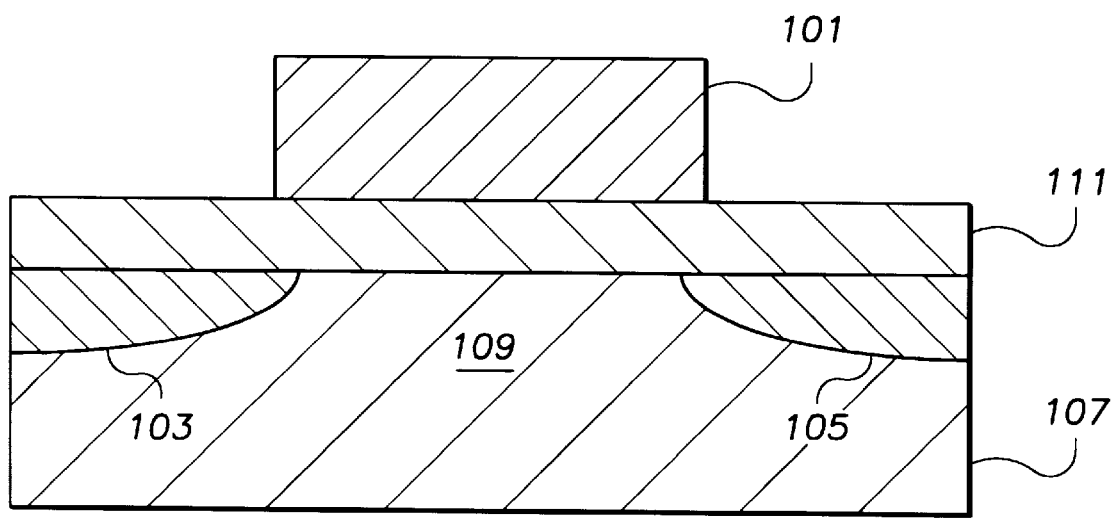
FIG. 1 illustrates components of a conventional MOS transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a number of semiconductor devices which would benefit from the use of an extremely thin oxide layer. The invention has been found to be particularly advantageous in forming a thin silicon oxide gate dielectric layer for a MOS device, such as a NMOS, PMOS, CMOS, or BiCMOS device. While the present invention is not so limited, an appreciation of various aspects of the invention will be gained through the discussion below.

Figure 2:
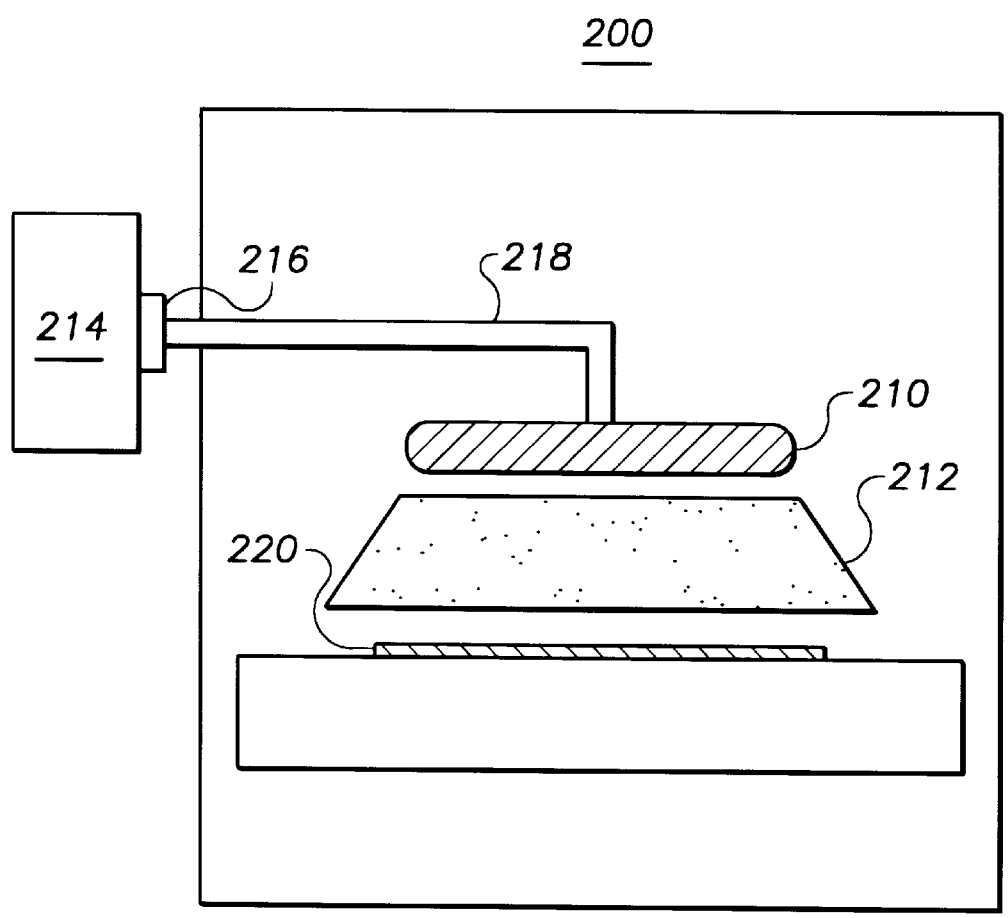
FIG. 2 illustrates an exemplary deposition chamber in accordance with one embodiment of the invention.

FIG. 2 illustrates an exemplary chamber for depositing an outgassed oxide on a semiconductor substrate. The exemplary chamber 200 generally includes an oxide source showerhead 210 for outgassing oxide 212, a gas source 214 including one or more gases, and a gas inlet 218 coupled between the gas source 214 and the showerhead 210 for flowing gas through the showerhead 210 to carry oxide 212 outgassed from the showerhead 210 to the semiconductor substrate 220. One or more controllers 216 are provided between the gas source 214 and the showerhead 210 for separately controlling the flow of each gas. The oxide source showerhead 210 may, for example, be a porous block of ultrapure quartz which, when heated, outgasses silicon oxide ($SiO_x$), including silicon monoxide (SiO) and/or silicon dioxide ($SiO_2$). Controllers (not shown) are also provided for controlling the temperature and pressure of the chamber. While not limited thereto, the chamber 200 may, for example, be an LPCVD (low-pressure chemical vapor deposition) reaction chamber.

In general, operation of the chamber 200 starts with the positioning of the substrate 220 proximate the quartz showerhead 210, typically with the surface to be coated facing the showerhead 210. Oxide is outgassed onto the substrate 220 by heating the showerhead 210 and flowing gas through the showerhead 210. Generally, the heating of the quartz causes silicon oxide to dissociate from the showerhead 210, while the gas flow serves to transport and deposit the outgassed oxide 212 on the semiconductor substrate 220 to form an oxide layer thereon. By controlling the gas flow rate and mixture, the oxide layer may be deposited on the substrate 220 at a highly controllable rate that provides for build up of a uniform (and, if desired, extremely thin) layer of silicon oxide.

The outgassing process is typically carried out with the chamber 200 at a subatmospheric pressure and at a temperature below 800° C. Suitable chamber temperatures for many applications range from about 400° C. to about 800° C. and, in the exemplary embodiment, range from about 500° C. to about 600° C. Suitable chamber pressures range from about 10 to about 100 millitorr (mtorr) and, in the exemplary embodiment, a chamber pressure of about 50 mtorr is used. Advantageously, the chamber temperatures are low compared to temperatures for conventional oxide deposition. The low temperature of the process, controllable nature of the gas flow rate and mixture, and use of oxide outgassing from quartz allows for the formation of oxide layers which can be as thin as a monomolecular layer. Of course, thicker layers may be formed if desired.

The gas source 214 typically includes a carrier gas, usually one or more inert gases such as argon or nitrogen. The gas source 214 may also include $NF_3$ for further controlling the outgassing process. As noted above, each gas of the gas source 214 is separately controlled using controllers. In this manner, the flow rate and composition of the gas (e.g., the ratio of nitrogen or argon to $NF_3$) that flows through the quartz showerhead 210 can be controlled to modify the rate and amount of oxide deposition. For example, as the ratio of $NF_3$ to the inert gas increases, the amount of oxide that is deposited decreases and, at sufficiently high ratios, oxide is removed from the substrate surface. Likewise, as the ratio of $NF_3$ to the inert gas decreases, oxide deposition increases. During deposition of an oxide layer, the flow rate or composition of the gas can be controlled to modify oxide deposition. For example, a run can start with a gas that has a significant amount of $NF_3$ to remove any native oxide. During the run, the amount of $NF_3$ may be decreased and the amount of an inert gas, like nitrogen or argon, increased in order to deposit outgassed oxide. The use of $NF_3$ can further be used to modify the thickness of a layer laid down earlier in the process. For example, after an oxide layer has been deposited, flow of a gas with significant levels (e.g., 50% $NF_3$) of $NF_3$ can remove part of the oxide layer. Advantageously, the gas removes the oxide layer without introducing significant amounts of matter which may degrade the performance of the oxide layer. Such manipulation of the gas content allows enhanced control of the deposition rate and thickness of the oxide layer.

Figure 3:
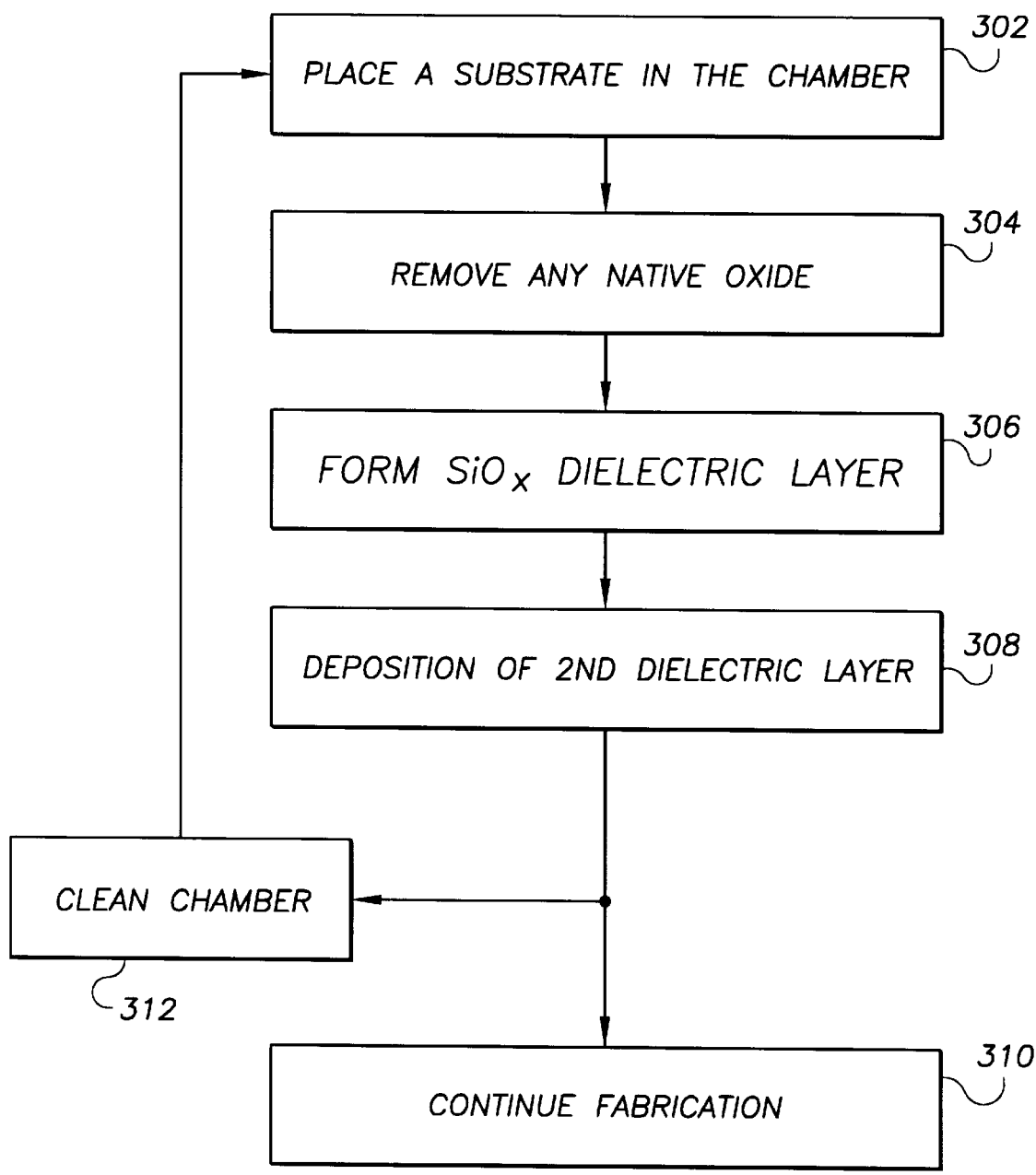
FIG. 3 is a flow chart illustrating an exemplary fabrication process in accordance with another embodiment of the invention.

The above apparatus may generally be used to form an outgassed oxide layer over a substrate. The flow chart of FIG. 3 more particularly illustrates an exemplary process of fabricating a semiconductor device having a silicon oxide gate dielectric layer formed from outgassing of silicon oxide. FIG. 3 will be described with reference to FIG. 4 which illustrates a semiconductor device having a silicon oxide gate dielectric layer. At block 302, one or more substrates are placed in a deposition chamber such as the chamber 200 above, for example. After introduction into the chamber, the substrate 401, typically a silicon substrate, is typically prepared for oxide outgassing by removing any native oxide from the substrate surface, as shown at block 304. This removal process may be performed by flowing $NF_3$ through the showerhead and over the substrate 401. Suitable $NF_3$ flow rates range from about 50 to 500 sccm (standard centimeter cubed per minute). The native oxide removal process can, for example, be performed while the substrate 401 is in the chamber and heating to the desired reaction temperature. Alternatively, the chamber may be heated prior to native oxide removal.

A layer of oxide 403 is then formed over the substrate 401 using an oxide source showerhead as indicated at block 306. This typically includes flowing gas through a heated oxide source showerhead to carry outgassed oxide onto the substrate surface, as described above. Typically, this involves reducing the flow of $NF_3$ and increasing the flow of inert gas(es), such as $N_2$ and/or Ar. In the exemplary embodiment using a quartz showerhead, the oxide layer formed comprises silicon oxide ($SiO_x$), including $SiO_2$ and/or SiO. The outgassed oxide layer 403 will be used at least in part as a gate dielectric. The thickness of the outgassed oxide layer 403 can vary depending on the desired properties of the gate dielectric and whether the gate dielectric is made up of the outgassed oxide layer alone or in combination with another dielectric. In the later case, suitable thickness range from about 1–3 molecules of oxide and up. Such thin oxide layers can be formed using a controlled flow of, for example, a carrier gas, such as nitrogen, and $NF_3$. For example, a monolayer of molecules of silicon oxide may be deposited by flowing a 100:10 $N_2:NF_3$ mixture at 50 sccm through a quartz showerhead for about 10–30 seconds. For example, a layer of silicon oxide two molecules thick may be deposited by flowing a 100:10 $N_2:NF_3$ mixture at 100 sccm through a quartz showerhead for about 10 to 30 seconds. The thin silicon oxide dielectric layer 405 is advantageously compatible with the silicon surface and acts as a transition or buffer region for any film that is subsequently deposited.

A second dielectric layer 405 may optionally be formed over the outgassed oxide layer 403 as indicated at block 308. The second dielectric layer 405 may be formed from a dielectric material having a higher dielectric constant than silicon dioxide (e.g., a silicon nitride) or even a dielectric material having a higher dielectric constant than silicon nitride (e.g., titanium oxide or barium strontium titanate). The second dielectric layer 405 and outgassed oxide layer 403 will be used as the gate dielectric for the resultant transistor device. The thickness of the second dielectric layer 405 is suitably selected in consideration of the thickness of the oxide layer 403 and the desired capacitive properties of the gate dielectric 403/405. The thickness of the second dielectric layer 405 may, for example, be selected to provide the gate dielectric 403/405 with a capacitance equivalent to 5 to 10 Å of silicon dioxide. Of course, the gate dielectric 403/405 may be provided with a higher equivalent capacitance (e.g., 10 to 25 Å of $SiO_2$) if desired. However, as the equivalent capacitance of the gate dielectric is scaled down, drive current control as well as device speed increases.

Formation of the second dielectric layer 405 may be performed using, for example, well-known deposition techniques such as LPCVD, sputter deposition, plasma-enhanced CVD, CVD, or remote plasma deposition. Advantageously, the deposition may be performed in-situ with, i.e., in the same reaction chamber, as the formation of the oxide layer 403. For example, both the outgassed oxide layer 403 and second dielectric layer 405 may be formed in an LPCVD chamber. Alternatively, the second dielectric chamber may be formed in a different reaction chamber. In such a case, it is typically desirable to move the substrate 401 between the two reaction chambers while under vacuum to prevent growth of native oxide which would increase the thickness of the outgassed oxide layer 403.

As noted above, the formation of the second dielectric layer 405 is optional. In certain applications, the outgassed oxide layer 403 may alone be used as the gate dielectric for the transistor device. In such applications, thicknesses of the oxide 403 are typically thicker than the one or two molecule thickness of the exemplary embodiment and often range from about 5 to 25 Å for many applications. Outgassed oxide layer 403 thicknesses in the range of 5 to 25 Å may be formed by simply outgassing oxide or by outgassing oxide and subsequently reducing the deposited oxide layer using an increased flow of $NF_3$.

Figure 4:
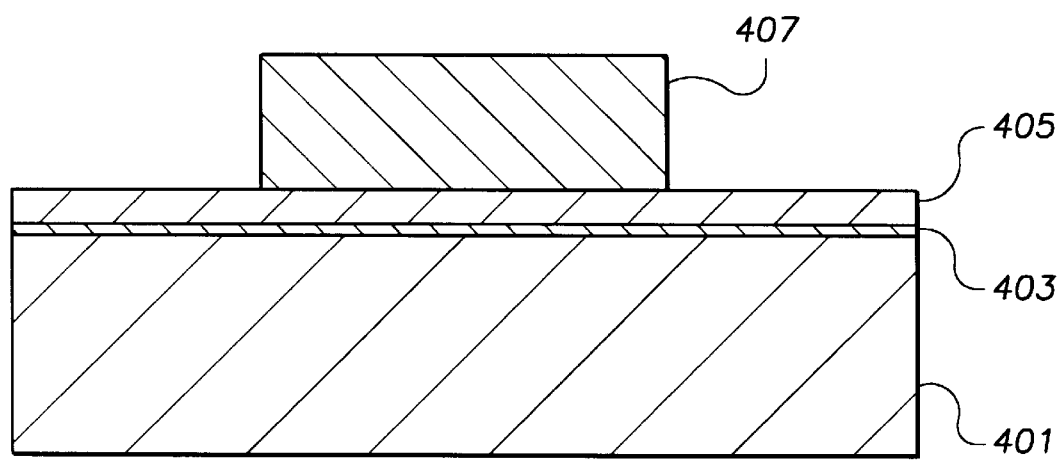
FIG. 4 illustrates an exemplary MOS device in accordance with yet another embodiment of the invention.

As indicated at block 310, fabrication of a semiconductor device may then continue with known fabrication steps, such as gate electrode formation, source/drain formation, silicidation and so forth to complete the ultimate device structure. Gate electrode formation may, for example, be performed by depositing a layer of gate electrode material, such as polysilicon or iridium over the substrate 401 and etching the gate electrode material to form one or more gate electrodes 407 (only one of which is shown). A semiconductor device structure after gate electrode formation is shown in FIG. 4. Deposition and etching of the gate electrode material may be performed using, for example, well-known techniques.

As the semiconductor substrate 401 is moved along the processing line for continued fabrication, the chamber is prepared for outgassing oxide on a subsequent substrate. Typically, this includes cleaning the chamber, as indicated at block 312, before placing another substrate in the chamber, as indicated at block 302. The chamber may be cleaned by, for example, increasing the flow of $NF_3$ through the chamber in order to remove any residual oxide on the showerhead and/or chamber walls. Cleaning of the chamber between runs reduces oxide build up on the showerhead and typically tends to increase oxide layer thickness uniformity between runs. Optionally, this step may be omitted with the chamber being cleaned along with the native oxide removal at block 304. In yet other cases, it may be desirable to perform a number of fabrication runs through the chamber without cleaning the chamber between runs.

Using the above fabrication process, a silicon oxide gate dielectric layer may be formed in a highly controlled manner. The silicon oxide gate dielectric layer may, for example, be an extremely thin (e.g., one or two molecules thick) layer of oxide. Such a thin oxide can, for example, reduce hot electrode injection into the gate as well as provide a buffer layer between the substrate and subsequently deposited layers. Moreover, through the use of an extremely thin silicon oxide layer and a material with a permittivity greater than that of silicon dioxide, gate dielectrics of transistor devices can be significantly scaled as compared to conventionally formed gate dielectrics. For example, using these techniques, gate dielectrics having the equivalent capacitance of 5 to 10 Å of silicon dioxide may be formed. This can, for example, provide increased control over drive current and enhanced device performance.

As noted above, the present invention is applicable to fabrication of a number of different devices where outgassed oxide layers and/or the associated advantages obtained therefrom are desired. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

What is claimed is:

1. A process of fabricating a semiconductor device, comprising:

placing a substrate in a chamber having an oxide source showerhead; and outgassing oxide from the showerhead to form an oxide layer on the substrate.

2. The process of claim 1, further including forming a gate electrode over the oxide layer, the oxide layer being used at least in part as a gate dielectric.

3. The process of claim 2, further including forming a dielectric layer over the oxide layer prior to forming the gate electrode, the oxide layer and dielectric layer being used at least in part as the gate dielectric.

4. The process of claim 3, wherein forming the dielectric layer includes depositing the dielectric layer in the chamber.

5. The process of claim 3, wherein the dielectric layer is formed from a material having a higher dielectric constant than silicon dioxide.

6. The process of claim 3, wherein the dielectric layer is formed from a material having a higher dielectric constant than silicon nitride.

7. The process of claim 1, wherein placing the substrate in the chamber includes placing the substrate in the chamber at a temperature of about 500 to 700° C.

8. The process of claim 1, wherein placing the substrate in the chamber includes placing the substrate in the chamber at a pressure of about 50 millitorr.

9. The process of claim 1, further including removing any native oxide from the substrate after placing the substrate in the chamber and before outgassing oxide from the showerhead to form the oxide layer.

10. The process of claim 9, wherein removing any native oxide includes flowing $NF_3$ over the substrate.

11. The process of claim 10, wherein flowing $NF_3$ over the substrate includes flowing $NF_3$ through the showerhead.

12. The process of claim 1, wherein outgassing oxide from the showerhead to form the oxide layer includes flowing gas through the showerhead.

13. The process of claim 12, wherein the gas includes nitrogen.

14. The process of claim 1, wherein the showerhead is formed from quartz.

15. The process of claim 1, wherein the oxide layer has a thickness of 2 molecules or less.

16. The process of claim 1, further including moving the substrate out of the chamber and subsequently cleaning the chamber.

17. The process of claim 16, wherein cleaning the chamber includes flowing $NF_3$ through the showerhead.

18. The process of claim 1, wherein outgassing oxide includes outgassing a silicon oxide.

19. The process of claim 18, wherein the silicon oxide includes one or more of silicon monoxide and silicon dioxide.

* * * * *